United States Patent
Tanaka et al.

(10) Patent No.: US 7,282,979 B2
(45) Date of Patent: Oct. 16, 2007

(54) PHASE SHIFTING DEVICE

(75) Inventors: Takatoshi Tanaka, Amagasaki (JP); Mitsuru Tanabe, Katano (JP); Shigeru Kataoka, Kawasaki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 98 days.

(21) Appl. No.: 11/226,295

(22) Filed: Sep. 15, 2005

(65) Prior Publication Data

US 2006/0055442 A1 Mar. 16, 2006

(30) Foreign Application Priority Data

Sep. 16, 2004 (JP) ............... 2004-270041

(51) Int. Cl.
*H03H 11/16* (2006.01)
(52) U.S. Cl. .................... 327/237; 327/231
(58) Field of Classification Search .......... None
See application file for complete search history.

(56) References Cited

U.S. PATENT DOCUMENTS

| | | | | |
|---|---|---|---|---|
| 3,337,872 A * | 8/1967 | Earp | ............ | 342/458 |
| 5,644,260 A * | 7/1997 | DaSilva et al. | ............ | 327/238 |
| 5,926,052 A * | 7/1999 | Dow et al. | ............ | 327/234 |
| 6,628,343 B1 | 9/2003 | Yamaguchi et al. | ........ | 348/731 |
| 6,815,993 B1 | 11/2004 | Ishimoto et al. | ............ | 327/247 |
| 7,123,103 B1 * | 10/2006 | Rosik et al. | ............ | 331/45 |

FOREIGN PATENT DOCUMENTS

| | | |
|---|---|---|
| JP | 5113546 | 4/1976 |
| JP | 2272910 | 11/1990 |
| JP | 6315037 | 11/1994 |
| JP | 08018397 | 1/1996 |
| JP | 1141063 | 2/1999 |
| JP | 200251096 | 2/2002 |
| WO | 0217485 | 2/2002 |

OTHER PUBLICATIONS

Japanese Office Action dated Dec. 12, 2006 with English translation.

* cited by examiner

*Primary Examiner*—Cassandra Cox
(74) *Attorney, Agent, or Firm*—Stevens, Davis, Miller & Mosher, LLP

(57) ABSTRACT

A phase shifting device includes a signal source; a variable phase shifter; first and second doubling circuits; and a 90-degree phase comparator. An output from the signal source is connected to an input of the variable phase shifter and to an input of the second doubling circuit, an output from the variable phase shifter is connected to an input of the first doubling circuit, an output from the first doubling circuit serves as a first output signal, and an output from the second doubling circuit serves as a second output signal. The first output signal and the second output signal are inputted to the 90-degree phase comparator. The amount of phase shift rotation of the variable phase shifter is changed by a phase shift control signal outputted from the 90-degree phase comparator. By this, an exact 90-degree phase shift is obtained.

8 Claims, 14 Drawing Sheets

Fig. 11A
Fig. 11B
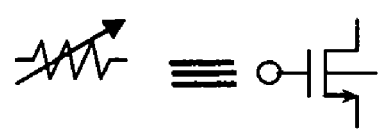
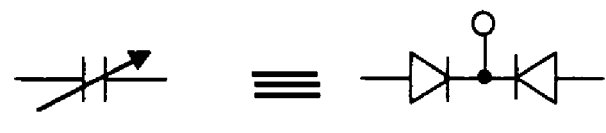

PHASE SHIFTING DEVICE

BACKGROUND OF THE INVENTION

1. Field of the Invention

The present invention relates to a phase shifting device for use in a wireless communication apparatus including a mobile communication terminal.

2. Description of the Background Art

In a 90-degree phase shifter used in a modulator-demodulator for orthogonal modulation signals, in order to obtain proper orthogonal signals, a 90-degree phase shift and equal amplitude need to be achieved with a high degree of accuracy.

As a 90-degree phase shifter having the simplest configuration, there is shown in FIG. 9 a phase shifter of a first conventional art. In the 90-degree phase shifter, the phase of an input signal is subjected to a +45-degree phase shift rotation using a circuit having a high-pass filter configuration composed of a resistor R11 and a capacitor C11. In addition, the phase of an input signal is subjected to a −45-degree phase shift rotation using a circuit having a low-pas filter configuration composed of a resistor R12 and a capacitor C12. Then, the signal having been subjected to a +45-degree phase shift rotation and the signal having been subjected to a −45-degree phase shift rotation are outputted from the respective circuits, whereby orthogonal signals whose phases are different by 90 degrees from each other are generated.

In the aforementioned conventional art 90-degree phase shifter, due to variation in value between elements or the influence of parasitic components in the integrated circuit, errors may occur in 90-degree phase shift and amplitude.

As a 90-degree phase shifting device which allows for the output of proper orthogonal signals by incorporating a correction circuit for correcting the phase error and amplitude error, there exists a phase correction circuit as shown in, for example, patent document 1, etc.

A 90-degree phase shifting device described in patent document 1 is shown in FIG. 10. The 90-degree phase shifting device has the following configuration. Specifically, the 90-degree phase shifting device uses a variable phase shifter 111 composed of variable resistors VR1 and VR2 which are capable of changing resistance values by a control signal, instead of using the resistors R11 and R12 of the CR phase shifter of FIG. 9. Two outputs from the variable phase shifter 111 are inputted to a 90-degree phase comparator 100, and a phase shift comparison result signal obtained by the phase comparator 100, which serves as a phase shift control signal 121, is then fed back to the variable phase shifter 111. By this, the resistance values of the variable resistors VR1 and VR2 are adjusted by the phase shift control signal 121 such that the phase shift between the two outputs from the variable phase shifter 111 is 90 degrees in a stable state.

Note that although FIG. 10 shows the variable phase shifter 111 using the variable resistors VR1 and VR2 instead of the resistors 11 land R12, it is also possible to use a variable phase shifter using variable capacitors instead of the capacitors C11 and C12. In this case, the capacitance values of the variable capacitors are adjusted by a phase shift control signal 121.

The variable resistor may be composed of, for example, a FET, as shown in FIG. 11A. The variable capacitor may be composed of, for example, a diode, as shown in FIG. 11B.

Patent document 1: Japanese Laid-Open Patent Publication No. 8-18397

With the configuration of the conventional art shown in FIG. 10, however, it is not possible to make the frequency of output signals and the frequency of an input signal different from each other. In addition, there is a need to derive, from the variable phase shifter, output signals having the same amount of phase shift rotation as a phase shift determined by the phase comparator. Since there is a limit to the amount of phase shift rotation that can be created with a variable phase shifter having a simple configuration, such as a CR variable phase shifter, it is difficult to output, with a simple configuration, signals having a large amount of phase shift rotation.

Moreover, in the configuration of the conventional art shown in FIG. 10, there are fluctuations in voltage between the input and output of the variable phase shifter 111. Thus, if a variable resistor or a variable capacitor is connected in series between the input and output terminals of the variable phase shifter 111, the resistance value of the variable resistor or the capacitance value of the variable capacitor changes in accordance with the change in potential, causing unstable operation of the variable phase shifter. Accordingly, signals having an exact 90-degree phase shift cannot be generated.

SUMMARY OF THE INVENTION

An object of the present invention is to provide a phase shifting device in which output signals having an amount of phase shift rotation, with respect to an input signal, which is equal to 1/N (N is an integer greater than or equal to 2) of a phase shift determined by a phase comparator, can be derived from a variable phase shifter.

Another object of the present invention is to provide a phase shifting device capable of making the frequency of output signals N times the frequency of an input signal.

A further object of the present invention is to provide a phase shifting device capable of generating two signals having an exact phase shift.

In a phase shifting device of the present invention, it is preferable to use only a CR variable phase shifter which does not use a variable capacitor. In the CR variable phase shifter, a fixed capacitor is connected in series between the input and output terminals, a drain of a FET is connected to the output terminal, a gate of the FET is connected to a control signal, and a source of the FET is connected to a ground. The FET functions as a variable resistor. Since the potential between the source and gate of the FET is fixed, even if the output from the variable phase shifter is changed, the resistance value of the variable resistor is still fixed, and thus the operation of the variable phase shifter is stabilized.

Such a configuration is based on considerations such as those described below. First, as a circuit in which even if the amplitude of an output is changed the amount of phase shift rotation is stable, it is preferable to use a variable phase shifter composed of a fixed capacitor and a variable resistor of a MOS transistor, for the following reason. Even if the drain voltage is changed, the value of an on-resistor of the MOS transistor is considered to be constant, provided that the source is grounded. If the positions of the capacitor and the resistor are switched, or if a variable-capacitance diode is used, there is a possibility that the resistance value of the variable resistor or the capacitance value of the variable capacitor may not be stabilized due to fluctuations in output.

Moreover, since a variable phase shifter composed of a fixed capacitor and a MOS transistor is a primary CR phase shifter, it is not possible for the variable phase shifter to perform a 90-degree phase shift rotation only by itself. The use of a doubling circuit allows the required amount of phase shift rotation of a variable phase shifter composed of a fixed capacitor and a MOS transistor to be 45-degrees. Accordingly, with the use of a variable phase shifter having a simple configuration composed of a fixed capacitor and a MOS transistor, orthogonal signals can be easily generated.

An N multiplying circuit, an arbitrary variable phase shifter, or the like is an extension of the above-described configuration. The first advantageous effect obtained by extending the configuration to an N multiple is that output signals having an amount of phase shift rotation, with respect to an input signal, which is equal to 1/N of a phase shift determined by a phase comparator can be derived from a variable phase shifter. The second advantageous effect is that the frequency of output signals can be made N times the frequency of an input signal.

Although, in a phase shifting device of the present invention, it is preferable to use the aforementioned variable phase shifter, it is also possible to use other variable phase shifters.

A phase shifting device using the aforementioned variable phase shifter will be described in detail below.

In a phase shifting device of the present invention, a first variable phase shifter, to which an output signal from a signal source is inputted and which is capable of changing the amount of phase shift rotation, and a first N multiplying circuit (N is an integer greater than or equal to 2) are connected in series. A first output signal which is an output from the first N multiplying circuit has a phase change, with respect to the output signal from the signal source, which is N times that of the first variable phase shifter, and the frequency becomes N times higher.

On the other hand, an output signal from the signal source is connected to an input of a second N multiplying circuit. A second output signal which is an output from the second N multiplying circuit does not have a phase shift with respect to the output signal from the signal source, and the frequency becomes N times higher.

When the first output signal and the second output signal are inputted to a phase comparator, the phase comparator outputs a signal proportional to a phase shift relative to a phase determined by the phase comparator itself. The phase determined by the phase comparator is arbitrary.

The output signal from the phase comparator serves as a first phase shift control signal. The first phase shift control signal is fed back to the first variable phase shifter to allow the phase shift of the first variable phase shifter to be changed. By this, the phase shift of the first output signal can be changed.

The aforementioned system is stabilized when the phase shift between the first output signal and the second output signal, which are input signals to the phase comparator, reaches the phase determined by the phase comparator.

Therefore, by using a 90-degree phase comparator, it is possible to obtain output signals having an exact 90-degree phase shift which is necessary for orthogonal modulation. Note that the amount of phase shift rotation of the first variable phase shifter at this time is 90/N degrees.

Furthermore, in the present invention, the phase shift between output signals can be adjusted according to the phases to be compared by the phase comparator. In addition, from an output from the variable phase shifter, a signal having a phase shift which is equal to 1/N of the phase shift between output signals can be derived as an output signal.

The following description is made, as an example, such that the phase shift of the phase comparator is 90 degrees, and N for the N multiplying circuit is 2.

In the above-described phase shifting device of the present invention, even if the phase shift between a first output signal and a second output signal is 90 degrees, the amplitudes of the signals are not always equal due to the gain of the first variable phase shifter.

As a first means of making the amplitudes equal in the above-described configuration, the first output signal may be connected to an input of a first gain limiting circuit, and the second output signal may be connected to an input of a second gain limiting circuit. By doing so, a third output signal, which is an output from the first gain limiting circuit, and a fourth output signal, which is an output from the second gain limiting circuit, can achieve a 90-degree phase shift and equal amplitude which are of proper orthogonal signals.

As a second means of making the amplitudes equal in the above-described configuration, the first output signal may be connected to an input of a variable-gain amplifier, a third output signal, which is an output from the variable-gain amplifier, and the second output signal may be connected to inputs of a level comparator, and an output from the level comparator may be fed back, as a gain control signal, to the variable-gain amplifier. By doing so, when the inputs of the level comparator are equal, the system condition is stabilized, and thus, the third output signal and the second output signal can achieve a 90-degree phase shift and equal amplitude which are of proper orthogonal signals.

As a third means of making the amplitudes equal in the above-described configuration, a first gain limiting circuit may be connected in series between the first variable phase shifter and the first doubling circuit, and a second gain limiting circuit may be connected in series with and before the second doubling circuit. By doing so, the input level of the first doubling circuit and the input level of the second doubling circuit become equal, and thus, the first output signal and the second output signal can achieve a 90-degree phase shift and equal amplitude which are of proper orthogonal signals.

As a fourth means of making the amplitudes equal in the above-described configuration, a variable-gain amplifier may be connected in series between the first variable phase shifter and the first doubling circuit, an output from the variable-gain amplifier and an input signal to the second doubling circuit may be connected to inputs of a level comparator, and an output from the level comparator may be fed back, as a gain control signal, to the variable-gain amplifier. By doing so, when the inputs of the level comparator are equal, the system condition is stabilized, and thus, the output from the variable-gain amplifier and the input signal to the second doubling circuit become equal. Consequently, the first output signal and the second output signal can achieve a 90-degree phase shift and equal amplitude which are of proper orthogonal signals.

As a fifth means of making the amplitudes equal in the above-described configuration, the first doubling circuit may be a variable-gain doubling circuit capable of controlling a gain, an output (first output signal) from the variable-gain doubling circuit and an output (second output signal) from the second doubling circuit may be inputted to a level comparator, and an output from the level comparator may be fed back, as a gain control signal, to the variable-gain doubling circuit. By doing so, when the inputs of the level comparators are equal, the system condition is stabilized, and thus, the output signals from the variable-gain doubling circuit and the second doubling circuit become equal. Consequently, the first output signal and the second output signal can achieve a 90-degree phase shift and equal amplitude which are of proper orthogonal signals.

In the above-described configuration, in order to make the amplitudes equal, the first and second N multiplying circuits each may have gain limiting functionality.

A single or a plurality of variable phase shifters (second variable phase shifters) may be provided in parallel with the first variable phase shifter, and a first phase shift control signal is fed back to each of the second variable phase shifters connected in parallel. It is preferable that to the second variable phase shifter(s) provided in parallel with the first variable phase shifter, either an output from the signal source or an inverted signal of an output from the signal source be inputted, and the amount of phase shift rotation can be changed by a second phase shift control signal. In addition, it is preferable that an output from the phase comparator be fed, as the second phase shift control signal, to the second variable phase shifter(s). Further, it is preferable that the first variable phase shifter and the second variable phase shifter have different amounts of phase shift rotation which are determined according to outputs from the phase comparator.

In the case where the first variable phase shifter is composed of a capacitor and a variable resistor in which the resistance value can be changed by a first phase shift control signal, the capacitance value of a capacitor included in the second variable phase shifter provided in parallel with the first variable phase shifter is made different from that of the capacitor included in the first variable phase shifter, and the same variable resistor in which the resistance value can be changed by the first phase shift control signal is used for the second variable phase shifter. Consequently, as an output from the second variable phase shifter, an arbitrary phase shift output can be obtained which varies depending on the way of selecting the capacitance value.

In the case where the first variable phase shifter is composed of a resistor and a variable capacitor in which the capacitance value can be changed by a first phase shift control signal, the second variable phase shifter provided in parallel with the first variable phase shifter can obtain an arbitrary phase shift output which varies depending on the way of selecting the resistance value of the second variable phase shifter.

It is preferable that the first variable phase shifter have either a high-pass or low-pass filter configuration in which a capacitor and a variable resistor capable of changing a resistance value by the first phase shift control signal are connected.

It is preferable that the first variable phase shifter have either a high-pass or low-pass filter configuration in which a resistor and a variable capacitor capable of changing a capacitance value by the first phase shift control signal are connected.

It is preferable that either an on-resistor of an N-channel or P-channel transistor or a combined variable resistor in which the on-resistor of the transistor and a resistor are connected in series or in parallel be used as the variable resistor, and the first phase shift control signal be connected to a gate of the transistor to allow a resistance value to be changed.

Either a variable-capacitance diode or a combined variable capacitor in which the variable-capacitance diode and a capacitor are connected in series or in parallel may be used as the variable capacitor.

For a 90-degree phase shifting device provided with a circuit for correcting the aforementioned phase error and amplitude error, the input and output may be configured by differential signals.

According to the present invention, in an orthogonal modulator and a demodulator for orthogonally modulated signals, for example, orthogonal carrier signals can be outputted so as to have a 90-degree phase shift and equal amplitude which are of proper orthogonal signals, achieving a highly accurate orthogonal phase modulation/demodulation scheme.

Furthermore, according to the present invention, output signals having an amount of phase shift rotation, with respect to the phase of an input signal, which is equal to 1/N of the phases to be compared by a phase comparator can be obtained from a variable phase shifter.

Moreover, according to the present invention, signals having a frequency which is N times the frequency of an input signal can be obtained.

BRIEF DESCRIPTION OF THE DRAWINGS

FIGS. 11A and 11B are diagrams showing configurations of a variable resistor and a variable capacitor, respectively;

DESCRIPTION OF THE PREFERRED EMBODIMENTS

Embodiments of the present invention will be described below with reference to the drawings.

A description of the embodiments of the present invention is made on the basis that a phase comparator is a 90-degree phase comparator in which the phases to be compared are 90 degrees, and an N multiplying circuit is a doubling circuit. Accordingly, in the following, a phase shifting device of the present invention is described as a 90-degree phase shifting device.

First Embodiment

Figure 1:
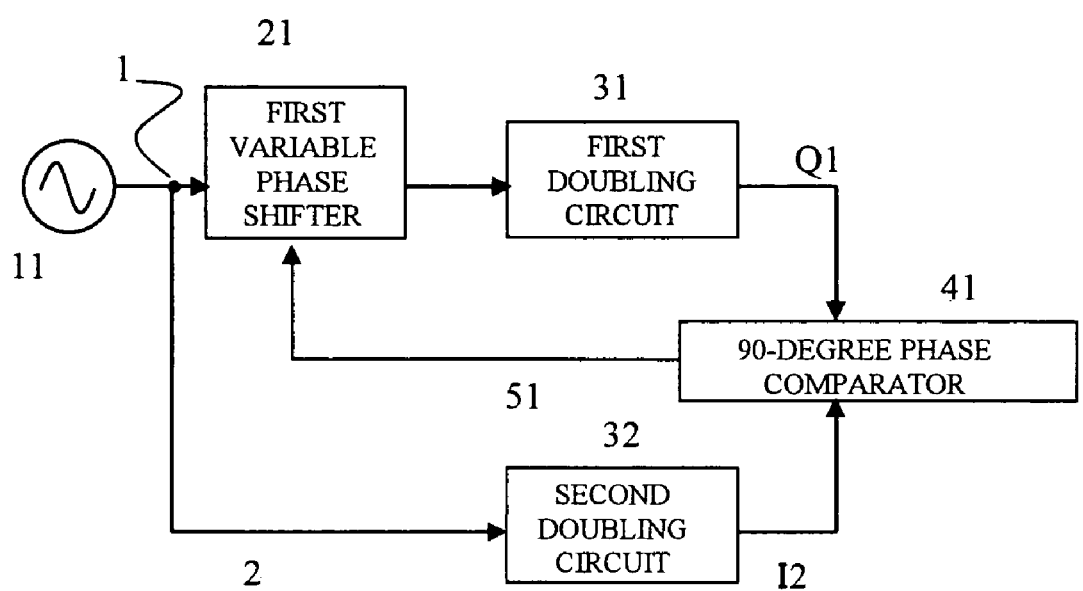
FIG. 1 is a circuit block diagram showing a configuration of a 90-degree phase shifting device according to a first embodiment of the present invention.

A 90-degree phase shifting device according to a first embodiment of the present invention is shown in FIG. 1. The 90-degree phase shifting device has a signal source 11; a first variable phase shifter 21 capable of changing the amount of phase shift rotation by a first phase shift control signal 51; a first doubling circuit 31; a second doubling circuit 32; and a 90-degree phase comparator 41. Here, an output from the signal source 11 is split into two parts which serve as a first input signal 1 and a second input signal 2, respectively.

When the first input signal 1 and the second input signal 2 are written as V1 and V2, respectively, V1 and V2 are defined as follows:

$$V1=V2=A*\exp(j\omega t),$$

where A is the amplitude and ω is the angular frequency.

When the output from the first variable phase shifter 21 is written as V21, V21 is defined as follows:

$$V21=B*\exp(j\omega t+\theta),$$

where B is the amplitude and θ is the amount of phase shift rotation of the first variable phase shifter 21. When a first output signal Q1 which is an output from the first doubling circuit 31 having an input to which an output from the first variable phase shifter 21 is connected, is written as V31, V31 is defined as follows:

$$V31=C*\exp(j2\omega t+2\theta),$$

where C is the amplitude.

When a second output signal I2 which is an output from the second doubling circuit 32 is written as V32, V32 is defined as:

$$V32=D*\exp(j2\omega t),$$

where D is the amplitude. The amplitudes C and D of the output signals are not always equal due to the gain of the first variable phase shifter 21.

Further, the first output signal Q1 and the second output signal I2 are connected to two inputs of the 90-degree phase comparator 41, respectively. Then, a phase comparison result signal which is proportional to the phase shift between the first output signal Q1 and the second output signal I2 is fed back, as a first phase shift control signal 51, to the first variable phase shifter 21. By this, feedback control is performed such that the phase shift between the first output signal Q1 and the second output signal I2 is constant (90 degrees). Consequently, an exact 90-degree phase shift is achieved between the first output signal Q1 and the second output signal I2. Here, the amount of phase shift rotation θ of the first variable phase shifter 21 is 45 degrees.

Figure 12:
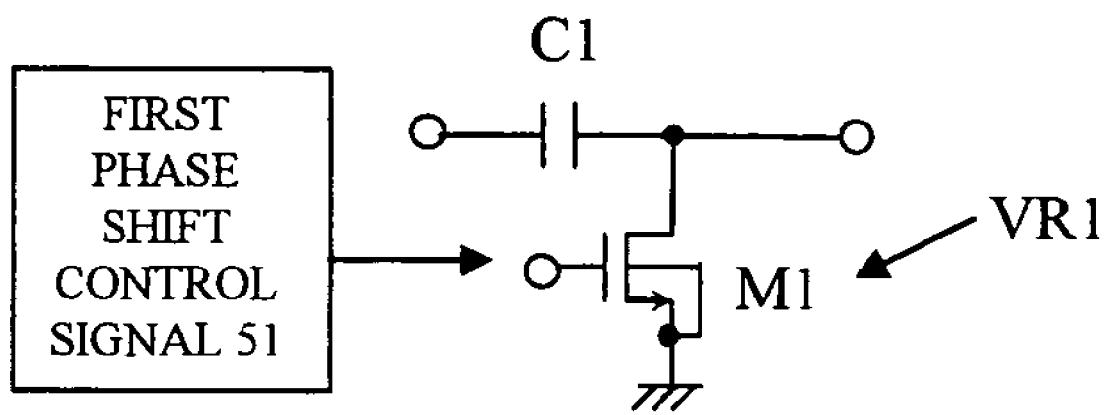
FIG. 12 is a circuit diagram showing an exemplary first variable phase shifter.

A specific example of the first variable phase shifter 21 is shown in FIG. 12. The first variable phase shifter 21 is composed of a fixed series capacitor C1 and a shunt MOS transistor M1. Specifically, in the first variable phase shifter 21, a drain of the MOS transistor M1 is connected to the capacitor C1, a source of the MOS transistor M1 is grounded, and a first phase shift control signal 51 is connected to a gate of the MOS transistor M1. The MOS transistor M1 functions as a variable resistor VR1, and the capacitor C1 and the MOS transistor M1 compose a high-pass filter. Note that, as a MOS transistor, either an N-channel transistor or a P-channel transistor may be used. Note also that although, as a variable resistor, the on-resistor of either an N-channel or P-channel MOS transistor is used as described above, it is also possible to use a combined variable resistor in which the on-resistor of a MOS transistor and a fixed resistor are connected in series or in parallel.

By allowing the resistance value of the variable resistor VR1 to be changed by the first phase shift control signal 51, the amount of phase shift rotation can be theoretically changed in a range from 0 to 90 degrees. Hence, by adjusting the first phase shift control signal 51, θ can be made to be 45 degrees.

In the above-described configuration, even if the voltage is changed at the input and output ends of the first variable phase shifter 21, since there is no voltage fluctuation between the first phase shift control signal 51 connected to the gate of the MOS transistor M1 and the ground connected to the source, a stable amount of phase shift rotation can be obtained.

As an embodiment, it is desirable to use the above-described variable phase shifter; however, it is also possible to use a variable phase shifter having a low-pass filter configuration in which the positions of a fixed capacitor and a variable resistor are switched.

Alternatively, it is also possible to use a variable phase shifter having a high-pass or low-pass filter configuration which uses a variable capacitor and a fixed resistor. Here, as a variable capacitor, it is preferable to use a variable-capacitance diode or a combined variable capacitor in which a variable-capacitance diode and a fixed capacitor are connected in series or in parallel.

Second Embodiment

In the above-described 90-degree phase shifting device of FIG. 1 according to the first embodiment, although a phase shift of exactly 90 degrees can be achieved, the amplitudes are not always equal. While the first input signal 1 passes through the first variable phase shifter 21, the second input signal 2 does not pass through any variable phase shifter; therefore, a large amplitude error occurs between the first output signal Q1 and the second output signal I2.

Figure 2:
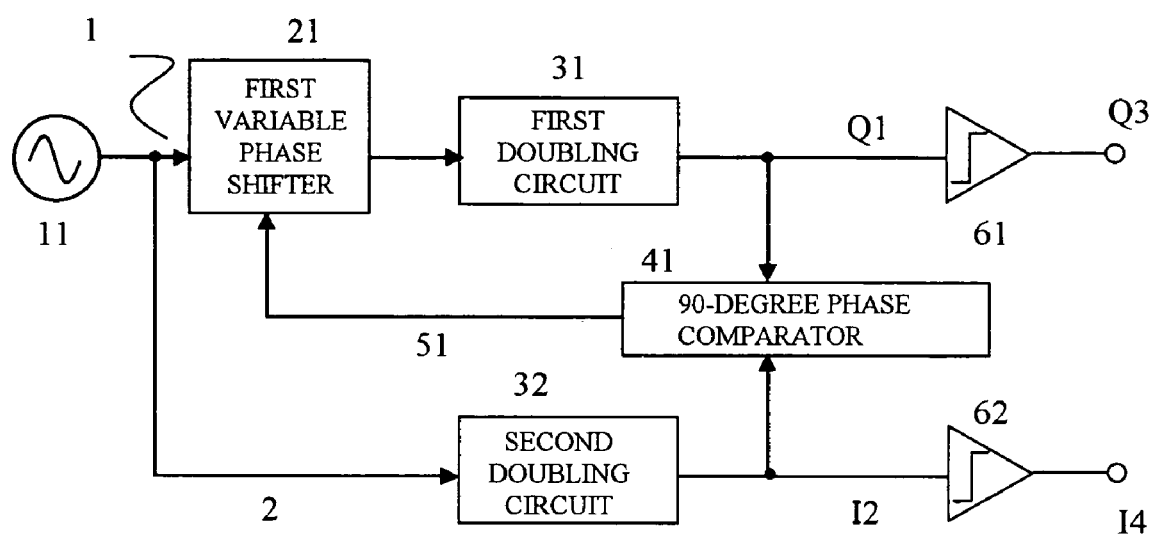
FIG. 2 is a circuit block diagram showing a configuration of a 90-degree phase shifting device according to a second embodiment of the present invention.

A second embodiment of the present invention is shown in FIG. 2. The second embodiment provides a 90-degree phase shifting device with which not only an exact 90-degree phase shift can be achieved as in the first embodiment but also equal amplitude output signals can be obtained.

In the 90-degree phase shifting device, an input of a first gain limiting circuit 61 is connected to a first output signal Q1, and an output from the first gain limiting circuit 61 serves as a third output signal Q3. In addition, an input of a second gain limiting circuit 62 is connected to a second output signal I2, and an output from the second gain limiting circuit 62 serves as a fourth output signal I4. Accordingly, the third output signal Q3 and the fourth output signal I4 have equal amplitude. The phase shift is still 90 degrees.

Note that instead of providing the first and second gain limiting circuits 61 and 62, it is also possible to allow first and second doubling circuits 31 and 32 to have gain limiting functionality. By such a configuration too, the amplitudes of the first output signal Q1 and the second output signal I2 can be made equal.

Third Embodiment

Figure 3:
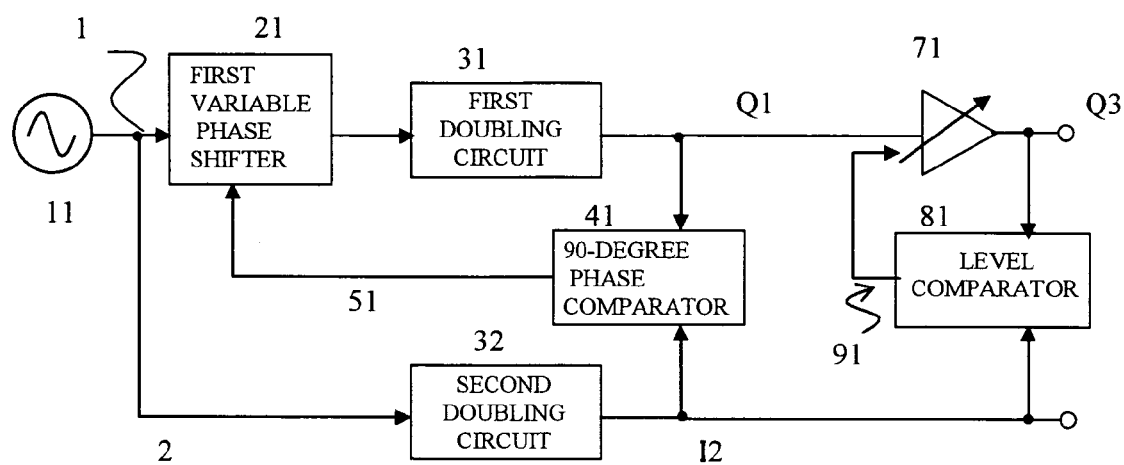
FIG. 3 is a circuit block diagram showing a configuration of a 90-degree phase shifting device according to a third embodiment of the present invention.

A third embodiment of the present invention is shown in FIG. 3. The third embodiment provides a 90-degree phase shifting device with which not only an exact 90-degree phase shift can be achieved as in the first embodiment but also equal amplitude output signals can be obtained.

In the 90-degree phase shifting device, an input of a variable-gain amplifier 71 is connected to a first output signal Q1, and an output from the variable-gain amplifier 71 serves as a third output signal Q3. In addition, a second output signal I2 and the third output signal Q3 are connected to inputs of a level comparator 81. An output from the level comparator 81 is fed back, as a gain control signal 91, to the variable-gain amplifier 71.

By this, the gain of the variable-gain amplifier 71 is controlled such that the amplitudes of the second output signal I2 and the third output signal Q3 are equal. Accordingly, the third output signal Q3 and the second output signal I2 have equal amplitude. The phase shift is still 90 degrees.

Fourth Embodiment

Figure 4:
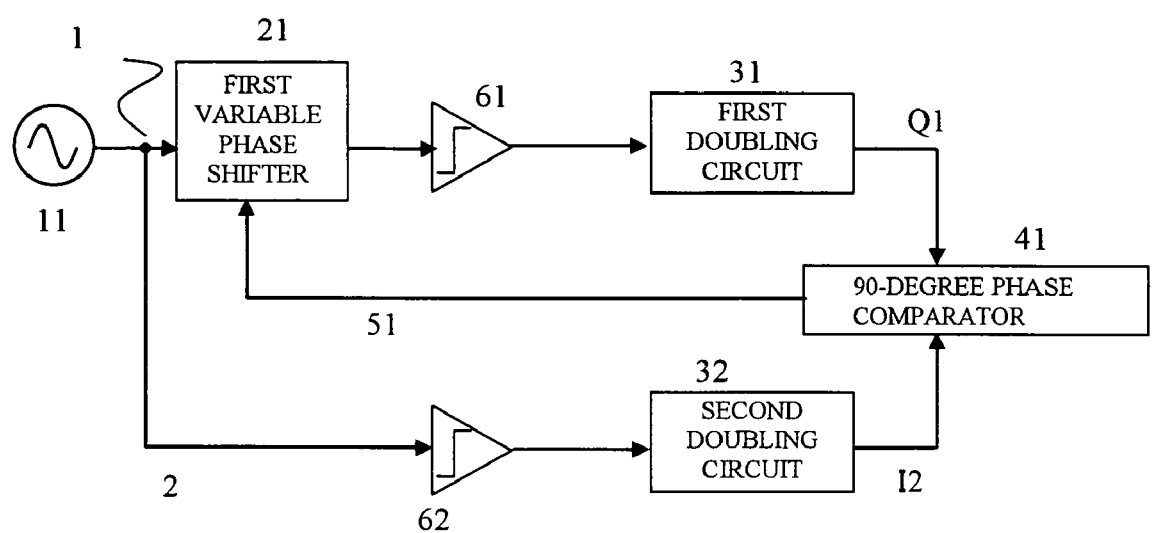
FIG. 4 is a circuit block diagram showing a configuration of a 90-degree phase shifting device according to a fourth embodiment of the present invention.

A fourth embodiment of the present invention is shown in FIG. 4. The fourth embodiment provides a 90-degree phase shifting device with which not only an exact 90-degree phase shift can be achieved as in the first embodiment but also equal amplitude output signals can be obtained.

In the 90-degree phase shifting device, again limiting circuit 61 is connected in series between a first variable phase shifter 21 and a first doubling circuit 31, and a second gain limiting circuit 62 is connected in series between a signal source 11 and a second doubling circuit 32.

By this, the amplitude of an input to the first doubling circuit 31 and the amplitude of an input to the second doubling circuit 32 become equal. Hence, if the first doubling circuit 31 and the second doubling circuit 32 have equal gain, a first output signal Q1 and a second output signal I2 accordingly have equal amplitude. The phase shift is still 90 degrees.

Fifth Embodiment

Figure 5:
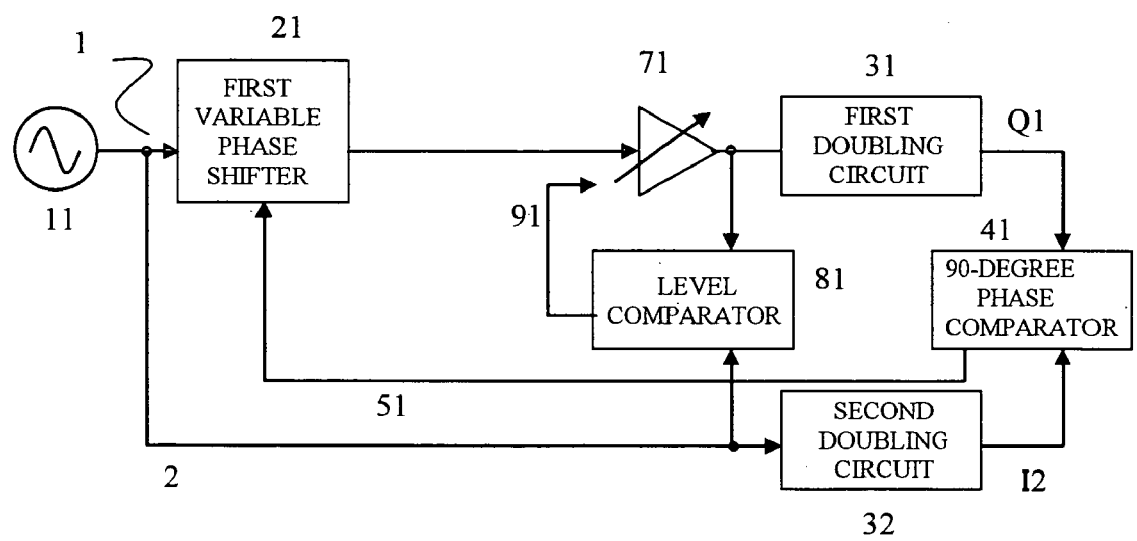
FIG. 5 is a circuit block diagram showing a configuration of a 90-degree phase shifting device according to a fifth embodiment of the present invention.

A fifth embodiment of the present invention is shown in FIG. 5. The fifth embodiment provides a 90-degree phase shifting device with which not only an exact 90-degree phase shift can be achieved as in the first embodiment but also equal amplitude output signals can be obtained.

In the 90-degree phase shifting device, a variable-gain amplifier 71 is connected in series between a first variable phase shifter 21 and a first doubling circuit 31, and an output from the variable-gain amplifier 71 and a second input signal 2 are connected to two inputs of a level comparator 81, respectively. Then, an output from the level comparator 81 is fed back, as a gain control signal 91, to the variable-gain amplifier 71.

By this, the gain of the variable-gain amplifier 71 is controlled such that the amplitudes of the second input signal 2 and the output from the variable-gain amplifier 71 are equal. Consequently, the amplitude of an input to the first doubling circuit 31 and the amplitude of an input to the second doubling circuit 32 become equal. Hence, if the first doubling circuit 31 and the second doubling circuit 32 have equal gain, a first output signal Q1 and a second output signal I2 accordingly have equal amplitude. The phase shift is still 90 degrees.

Sixth Embodiment

Figure 6:
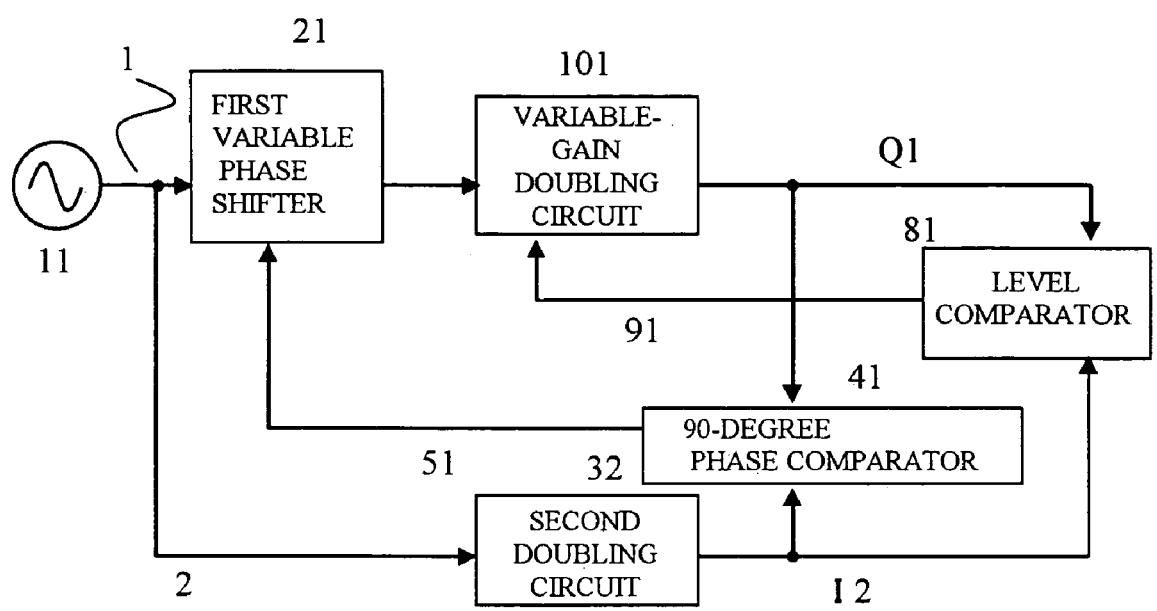
FIG. 6 is a circuit block diagram showing a configuration of a 90-degree phase shifting device according to a sixth embodiment of the present invention.

A sixth embodiment of the present invention is shown in FIG. 6. The sixth embodiment provides a 90-degree phase shifting device with which not only an exact 90-degree phase shift can be achieved as in the first embodiment but also equal amplitude output signals can be obtained.

In the 90-degree phase shifting device, the first doubling circuit 31 is replaced with a variable-gain doubling circuit 101 capable of adjusting gain, and a first output signal Q1 and a second output signal I2 are connected to two inputs of a level comparator 81, respectively. Then, an output from the level comparator 81 is fed back, as a gain control signal 91, to the variable-gain doubling circuit 101.

By this, the gain of the variable-gain doubling circuit 101 is controlled such that the amplitudes of the first output signal Q1 and the second output signal I2 are equal. Consequently, the first output signal Q1 and the second output signal I2 have equal amplitude. The phase shift is still 90 degrees.

Seventh Embodiment

Figure 7:
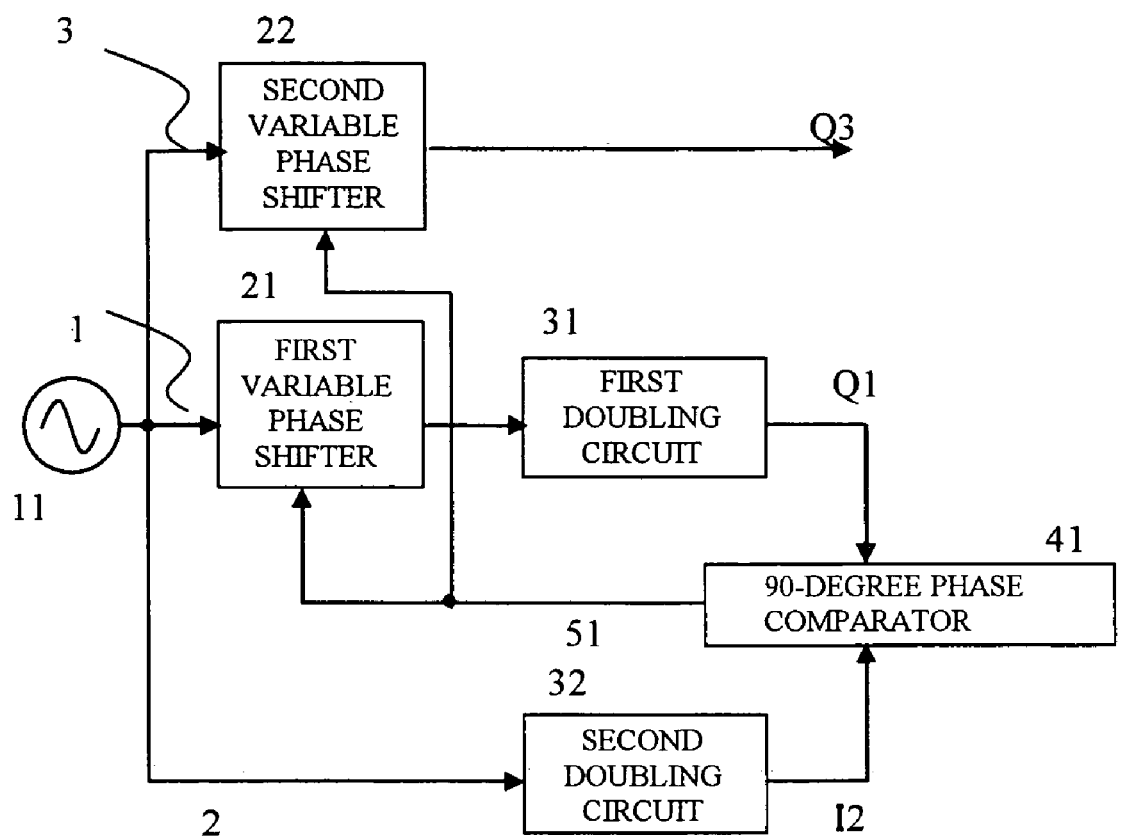
FIG. 7 is a circuit block diagram showing a configuration of a 90-degree phase shifting device according to a seventh embodiment of the present invention.

In a seventh embodiment of the present invention, in addition to each configuration of the first to sixth embodiments, a single or a plurality of second variable phase shifters are provided in parallel with a first variable phase shifter 21. As an example of the seventh embodiment, there is shown in FIG. 7 a configuration in which the above-described configuration is added to the configuration of the first embodiment. Here, as a representative example, a single second variable phase shifter 22 is shown. An output from a 90-degree phase comparator 41 is fed, as a second phase shift control signal, to the second variable phase shifter 22, and a third output signal Q3 is obtained from the second variable phase shifter 22. Here, the second phase shift control signal is the same signal as a first phase shift control signal 51.

Specifically, an input of the second variable phase shifter 22 is connected to an output from a signal source 11 (a third input signal 3 is shown as a representative example), and a first phase shift control signal 51 is fed back to the second variable phase shifter 22, whereby a third output signal Q3 is obtained from the second variable phase shifter 22.

In the 90-degree phase shifting device, in addition to the configuration of the first embodiment, an input of the second variable phase shifter 22 is connected to an input of the first variable phase shifter 21, and a first phase shift control signal 51 is fed to both of the first and second variable phase shifters 21 and 22.

In the case where each of the first and second variable phase shifters 21 and 22 is composed of a fixed capacitor and a variable resistor in which the resistance value can be changed by a first phase shift control signal 51, the capacitance value of a capacitor included in the second variable phase shifter 22 which is provided in parallel with the first variable phase shifter 21 is made different from the capacitance value of a capacitor included in the first variable phase shifter 21. In addition, the same variable resistor in which the resistance value can be changed by a first phase shift control signal 51 is used for the variable resistors. Consequently, as a third output signal Q3, an output having a phase shift rotation in a range from 0 to 90 degrees with respect to a first input signal 1, which varies depending on the way of selecting the capacitance value, can be obtained from the second variable phase shifter 22. When the inversion N1 of the first input signal is inputted to the second variable phase shifter 22, as a third output signal Q3, an output having a phase shift rotation in a range from −180 to −90 degrees with respect to the first input signal 1 can be obtained.

Now, the reason that a multiplying circuit is not provided to an output section of the second variable phase shifter 22 will be described. The present embodiment is characterized in that, as a third output signal Q3, a signal having an arbitrary phase shift output with respect to a first input signal Q1 can be derived. Hence, it is not necessary to perform doubling. If the phase shift between a first output signal Q1 and a second output signal I2 is 90 degrees, the output signal from the first variable phase shifter 21 has an amount of phase shift rotation of 45 degrees with respect to a first input signal.

Figure 14:
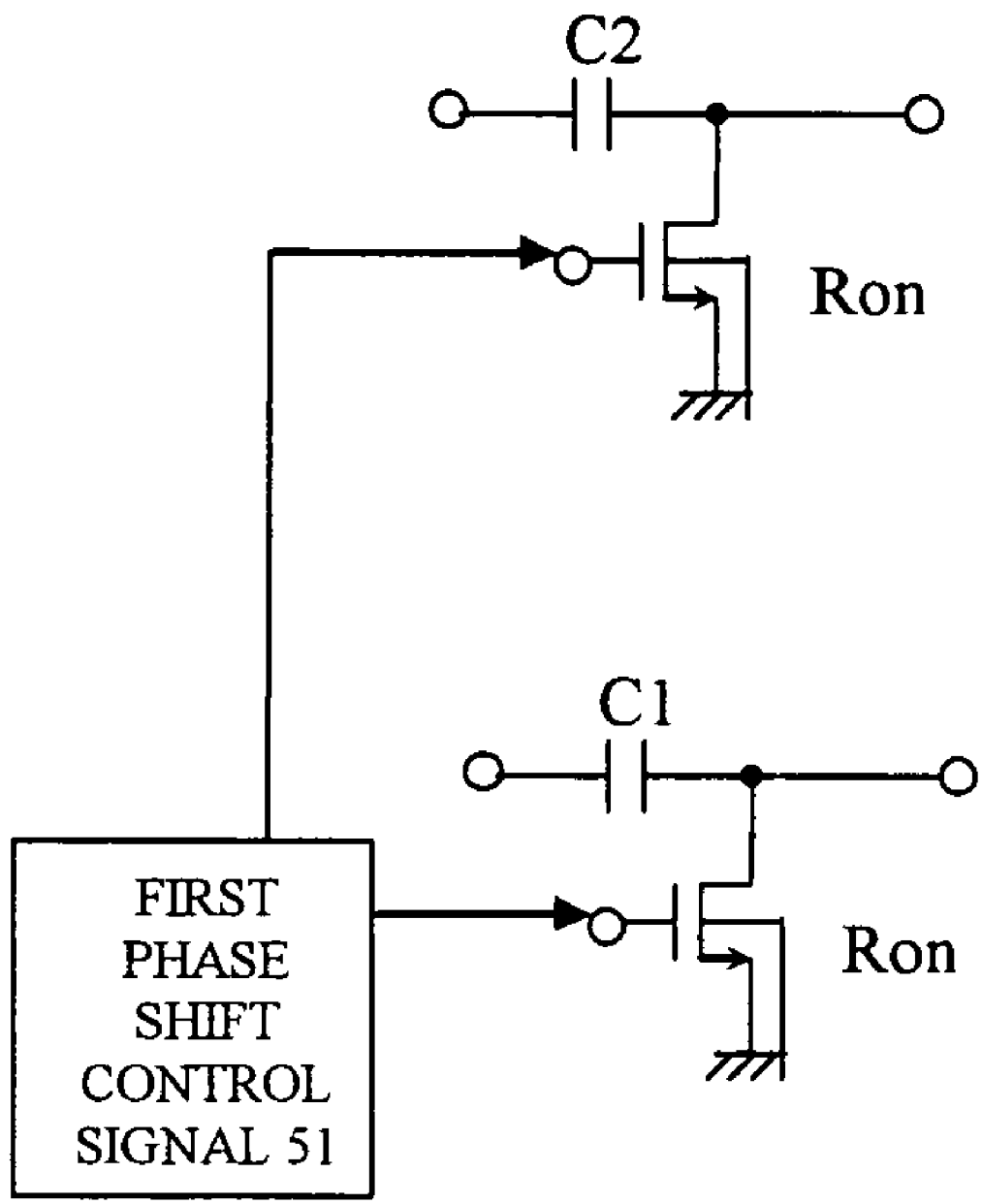
FIG. 14 is a circuit diagram showing specific examples of first and second variable phase shifters.

In FIG. 14, there is shown an exemplary circuit in which a variable phase shifter has the configuration shown in FIG. 12 and a capacitor of a first variable phase shifter, a capacitor of a second variable phase shifter, and a non-resistor of a MOS transistor are represented by C1, C2, and Ron, respectively. The reason that the amount of phase shift rotation can be arbitrarily adjusted in this circuit will be described below.

When, in the second variable phase shifter, the amount of phase shift rotation is θ, the following equations are established:

$$\theta = \arctan(\omega * Ron * C2)$$
$$= \arctan(C2/C1).$$

Hence, the amount of phase shift rotation θ can be adjusted by the capacitor C2.

In the first variable phase shifter, when the input angular frequency is ω, in order that the amount of phase shift rotation θ becomes 45 degrees, the on-resistor Ron should satisfy ω=1/Ron/C1. Thus, the following equation is established:

Amount of phase shift rotation=45 degrees=arctan (ω*Ron*C1)

In the case where the first variable phase shifter 21 is composed of a fixed resistor and a variable capacitor in which the capacitance value can be changed by a first phase shift control signal 51, as an output from the second variable phase shifter connected in parallel with the first variable phase shifter, an output having a phase shift rotation in a range from 0 to −90 degrees with respect to a first input signal, which varies depending on the way of selecting the value of the resistor of the second variable phase shifter, can be obtained. When the inversion N1 of the first input signal is inputted to the second variable phase shifter, as a third output signal Q3, an output having a phase shift rotation in a range from 180 to 90 degrees with respect to the first input signal 1 can be obtained.

Eighth Embodiment

Figure 8:
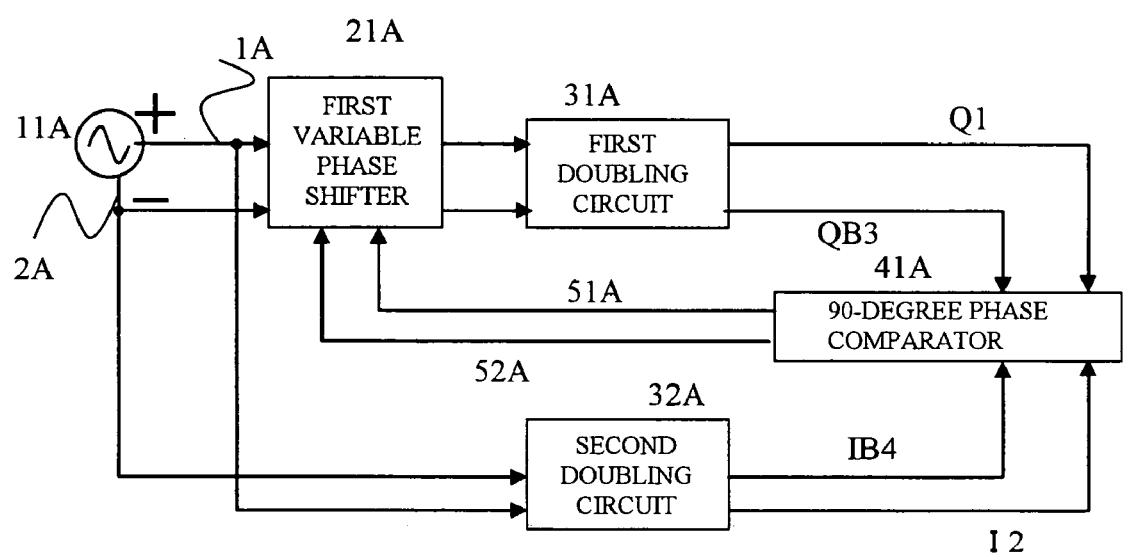
FIG. 8 is a circuit block diagram showing a configuration of a 90-degree phase shifting device according to an eighth embodiment of the present invention.
Figure 9:
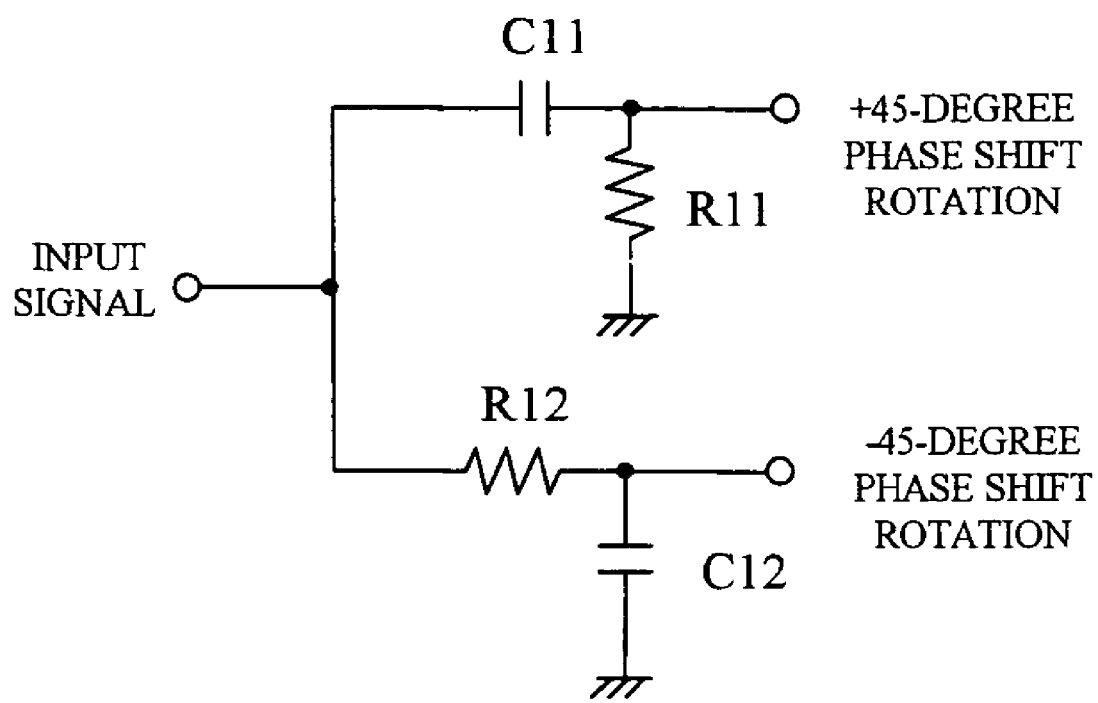
FIG. 9 is a circuit diagram showing a 90-degree phase shifter of conventional art.
Figure 10:
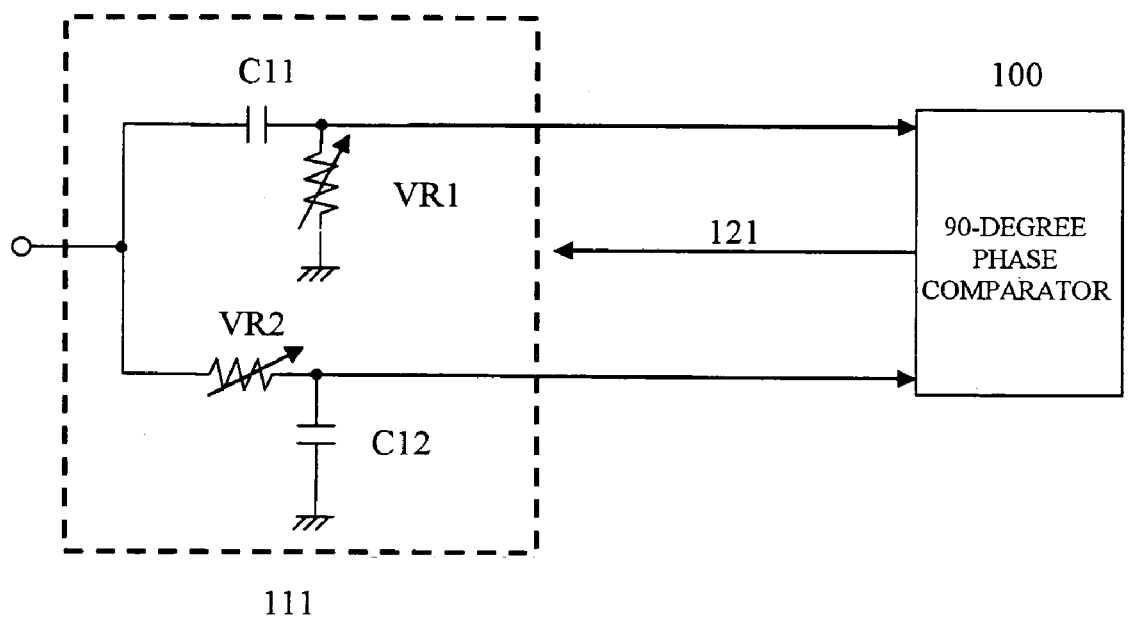
FIG. 10 is circuit block diagram showing a 90-degree phase shifting device of another conventional art.

In the 90-degree phase shifting devices of the first to sixth embodiments of the present invention, the input and output may use a differential configuration. As a representative example, there is shown in FIG. 8a 90-degree phase shifting device having the same configuration as that of the first embodiment shown in FIG. 1 except that the input and output of the 90-degree phase shifting device has a differential configuration. In the 90-degree phase shifting device, a signal source 11A, a first variable phase shifter 21A, a first doubling circuit 31A, a second doubling circuit 32A, and a 90-degree phase comparator 41A have a differential input/output configuration.

In this circuit, a first differential input signal 1A and a second differential input signal 2A are outputted from the source signal 11A, and then are inputted to the first variable phase shifter 21A and to the second doubling circuit 32A.

Outputs from the first variable phase shifter 21A are inputted to the first doubling circuit 31A. A first output signal Q1 and a third output signal QB3, which are outputs from the first doubling circuit 31A, and a second output signal I2 and a fourth output signal IB4, which are outputs from the second doubling circuit 32A, are inputted to the 90-degree phase comparator 41A. A first phase shift control signal 51A and a second phase shift control signal 52A, which are outputs from the 90-degree phase comparator 41A, are fed back to the first variable phase shifter 21A.

Figure 13:
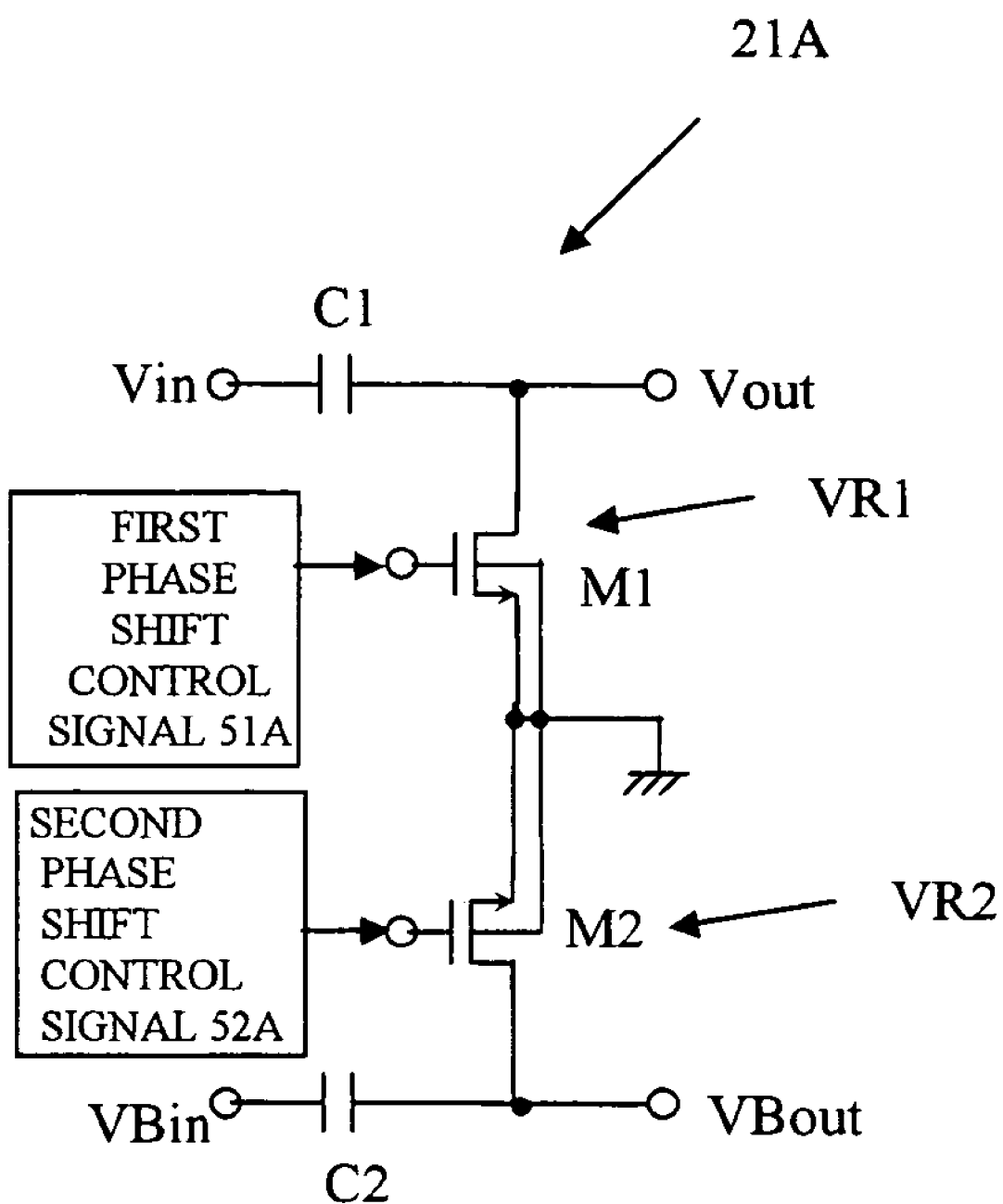
FIG. 13 is a circuit diagram showing another exemplary first variable phase shifter.

The circuit of the first variable phase shifter 21A having a differential input/output configuration is shown in FIG. 13. Here, as an example, the variable phase shifter shown in FIG. 12 is used.

In the first variable phase shifter 21A, a combination of a fixed capacitor C1 and a variable resistor VR1 and a combination of a fixed capacitor C2 and a variable resistor VR2 each have a high-pass filter type configuration. MOS transistors M1 and M2, which are used as variable resistors VR1 and VR2, share a common source, and the common source is either grounded or connected to a predetermined bias voltage. In FIG. 13, the common source is grounded. Then, a first phase shift control signal 51A is connected to a gate of the MOS transistor M1 which is used as the variable resistor VR1, and a second phase shift control signal 52A is connected to a gate of the MOS transistor M2 which is used as the variable resistor VR2.

In the variable phase shifter 21A, differential output signals Vout and VBout are obtained from differential input signals Vin and VBin, respectively.

The phase shift control signals 51A and 52A may share a common signal; however, it is preferable to prepare the phase shift control signals 51A and 52A for the differential input signals Vin and VBin, respectively. By this configuration, even if there is a mismatch between the capacitors C1 and C2 and between the MOS transistors M1 and M2 which are used as variable resistors, by individually feeding the phase shift control signals 51A and 52A, complete differential signal outputs can be obtained.

In the 90-degree phase shifting device, in order to achieve a 90-degree phase shift, the phase shift of a first output signal Q1 with respect to a second output signal I2 is detected by the 90-degree phase comparator 41A. Then, a first phase shift control signal 51A, which is an output proportional to the above-described phase shift, is fed back to the first variable phase shifter 21A. By doing so, the phase shift of the first output signal Q1 with respect to the second output signal I2 is made to be exactly 90 degrees.

Similarly, the phase shift of a third output signal QB3 with respect to a fourth output signal IB4 having a differential relationship with the second output signal I2 is detected by the 90-degree phase comparator 41A. Then, a second phase shift control signal 52A, which is an output proportional to the phase shift, is fed back to the first variable phase shifter 21A. By doing so, the phase shift of the third output signal QB3 with respect to the fourth output signal IB4 is made to be exactly 90 degrees.

Accordingly, the phase shift of each output signal with respect to the second output signal I2 is as follows, and differential output signals with an exact 90-degree phase shift can be obtained.

I2:0 degree Q1:90 degrees IB4:180 degrees QB3:270 degrees

Note that, in the above-described embodiments, as a variable phase shifter, one with a high-pass or low-pass filter configuration composed of a fixed capacitor and a variable resistor is used; however, instead of the above, it is also possible to use one with a high-pass or low-pass filter configuration composed of a fixed resistor and a variable capacitor. As a variable capacitor for such a case, it is preferable to use a variable-capacitance diode, for example.

INDUSTRIAL APPLICABILITY

A phase shifting device according to the present invention is capable of achieving a 90-degree phase shift and equal amplitude, with a high degree of accuracy, for proper orthogonal signals which are required in a modulator-demodulator for orthogonal modulation signals, and is useful as a circuit of a wireless communication apparatus including a communication module or a portable terminal, or the like.

What is claimed is:

1. A phase shifting device comprising:
   a signal source;
   a first variable phase shifter in which an amount of phase shift rotation can be changed by a first phase shift control signal;
   first and second N multiplying circuits (N is an integer greater than or equal to 2); and
   a phase comparator, wherein an output from the signal source is connected to an input of the first variable phase shifter and to an input of the second N multiplying circuit, an output from the first variable phase shifter is connected to an input of the first N multiplying circuit, an output from the first N multiplying circuit serves as a first output signal, and an output from the second N multiplying circuit serves as a second output signal, and the first output signal and the second output signal are inputted to the phase comparator, and an output from the phase comparator is fed back, as the first phase shift control signal, to the first variable phase shifter, whereby the amount of phase shift rotation of the first variable phase shifter is controlled such that a phase shift between the first output signal and the second output signal is constant, said phase shifting device further comprising: a first gain limiting circuit having an input to which the first output signal is connected; and a second gain limiting circuit having an input to which the second output signal is connected, wherein an output from the first gain limiting circuit serves as a third output signal, and an output from the second gain limiting circuit serves as a fourth output signal.

2. A phase shifting device comprising:
   a signal source;
   a first variable phase shifter in which an amount of phase shift rotation can be chancied by a first phase shift control signal;
   first and second N multiplying circuits (N is an integer greater than or equal to 2); and
   a phase comparator, wherein an output from the signal source is connected to an input of the first variable phase shifter and to an input of the second N multiplying circuit, an output from the first variable phase shifter is connected to an input of the first N multiplying circuit, an output from the first N multiplying circuit serves as a first output signal, and an output from the second N multiplying circuit serves as a second output signal, and the first output signal and the second output signal are inputted to the phase comparator, and an output from the phase comparator is fed back, as the first phase shift control signal, to the first variable phase shifter, whereby the amount of phase shift rotation of the first variable phase shifter is controlled such that a phase shift between the first output signal and the second output signal is constant, said phase shifting device further comprising: a variable-gain amplifier being capable of controlling a gain and having an input to which the first output signal is connected, an output from the variable-gain amplifier serving as a third output signal; and a level comparator to which the third output signal and the second output signal are inputted, wherein an output from the level comparator is fed, as a gain control signal, to the variable-gain amplifier, whereby a gain of the variable-gain amplifier is controlled such that a level of the third output signal and a level of the second output signal are equal.

3. A phase shifting device comprising:
   a signal source;
   a first variable phase shifter in which an amount of phase shift rotation can be changed by a first phase shift control signal;
   first and second N multiplying circuits (N is an integer greater than or equal to 2); and
   a phase comparator, wherein an output from the signal source is connected to an input of the first variable phase shifter and to an input of the second N multiplying circuit, an output from the first variable phase shifter is connected to an input of the first N multiplying circuit, an output from the first N multiplying circuit serves as a first output signal, and an output from the second N multiplying circuit serves as a second output signal, and the first output signal and the second output signal are inputted to the phase comparator, and an output from the phase comparator is fed back, as the first phase shift control signal, to the first variable phase shifter, whereby the amount of phase shift rotation of the first variable phase shifter is controlled such that a phase shift between the first output signal and the second output signal is constant, said phase shifting device further comprising: a first gain limiting circuit between the first variable phase shifter and the first N multiplying circuit; and a second gain limiting circuit before the second N multiplying circuit.

4. A phase shifting device comprising:
   a signal source;
   a first variable phase shifter in which an amount of phase shift rotation can be changed by a first phase shift control signal;
   first and second N multiplying circuits (N is an integer greater than or equal to 2); and
   a phase comparator, wherein an output from the signal source is connected to an input of the first variable phase shifter and to an input of the second N multiplying circuit, an output from the first variable phase shifter is connected to an input of the first N multiplying circuit, an output from the first N multiplying circuit serves as a first output signal, and an output from the second N multiplying circuit serves as a second output signal, and the first output signal and the second output signal are inputted to the phase comparator, and an output from the phase comparator is fed back, as the first phase shift control signal, to the first variable phase shifter, whereby the amount of phase shift rotation of the first variable phase shifter is controlled such that a phase shift between the first output signal and the second output signal is constant, said phase shifting device further comprising: a variable-gain amplifier being capable of controlling a gain and being provided between the first variable phase shifter and the first N multiplying circuit; and a level comparator for comparing an output level of the variable-gain amplifier with an input level of the second N multiplying circuit, wherein an output from the level comparator is fed, as a gain control signal, to the variable-gain amplifier, whereby a gain of the variable-gain amplifier is controlled such that a level of an output signal from the variable-gain amplifier and a level of an input signal to the second N multiplying circuit are equal.

5. A phase shifting device comprising:

a signal source;

a first variable phase shifter in which an amount of phase shift rotation can be changed by a first phase shift control signal;

first and second N multiplying circuits (N is an integer greater than or equal to 2); and a phase comparator, wherein an output from the signal source is connected to an input of the first variable phase shifter and to an input of the second N multiplying circuit, an output from the first variable phase shifter is connected to an input of the first N multiplying circuit, an output from the first N multiplying circuit serves as a first output signal, and an output from the second N multiplying circuit serves as a second output signal, and the first output signal and the second output signal are inputted to the phase comparator, and an output from the phase comparator is fed back, as the first phase shift control signal, to the first variable phase shifter, whereby the amount of phase shift rotation of the first variable phase shifter is controlled such that a phase shift between the first output signal and the second output signal is constant, wherein the first N multiplying circuit is a variable-gain N multiplying circuit capable of controlling a gain, the phase shifting device further comprising: a level comparator for comparing an output level of the variable-gain N multiplying circuit with an output level of the second N multiplying circuit, wherein an output from the level comparator is fed, as a gain control signal, to the variable-gain N multiplying circuit, whereby a gain of the variable-gain N multiplying circuit is controlled such that a level of an output signal from the variable-gain N multiplying circuit and a level of an output signal from the second N multiplying circuit are equal.

6. A phase shifting device comprising:

a signal source;

a first variable phase shifter in which an amount of phase shift rotation can be changed by a first phase shift control signal;

first and second N multiplying circuits (N is an integer greater than or equal to 2); and a phase comparator, wherein an output from the signal source is connected to an input of the first variable phase shifter and to an input of the second N multiplying circuit, an output from the first variable phase shifter is connected to an input of the first N multiplying circuit, an output from the first N multiplying circuit serves as a first output signal, and an output from the second N multiplying circuit serves as a second output signal, and the first output signal and the second output signal are inputted to the phase comparator, and an output from the phase comparator is fed back, as the first phase shift control signal, to the first variable phase shifter, whereby the amount of phase shift rotation of the first variable phase shifter is controlled such that a phase shift between the first output signal and the second output signal is constant, said phase shifting device further comprising a single or a plurality of second variable phase shifters to which either an output from the signal source or an inversion of an output from the signal source is inputted, and in which an amount of phase shift rotation can be changed by a second phase shift control signal.

7. The phase shifting device according to claim 6, wherein an output from the phase comparator is fed, as the second phase shift control signal, to the second variable phase shifter(s).

8. The phase shifting device according to claim 7, wherein the first variable phase shifter and the second variable phase shifter have different amounts of phase shift rotation which are determined according to outputs from the phase comparator.

* * * * *